United States Patent
Saenger et al.

(10) Patent No.: US 9,678,439 B2
(45) Date of Patent: Jun. 13, 2017

(54) MIRROR

(71) Applicant: Carl Zeiss SMT GmbH, Oberkochen (DE)

(72) Inventors: Ingo Saenger, Heidenheim (DE); Johannes Ruoff, Aalen (DE); Martin Endres, Koenigsbronn (DE); Thomas Eisenmann, Bremen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 156 days.

(21) Appl. No.: 14/623,882

(22) Filed: Feb. 17, 2015

(65) Prior Publication Data

US 2015/0160561 A1 Jun. 11, 2015

Related U.S. Application Data

(63) Continuation of application No. PCT/EP2013/067965, filed on Aug. 30, 2013.

(60) Provisional application No. 61/701,928, filed on Sep. 17, 2012.

(30) Foreign Application Priority Data

Sep. 17, 2012 (DE) .................. 10 2012 216 502

(51) Int. Cl.
*G03F 7/20* (2006.01)
*G02B 5/08* (2006.01)
*G02B 5/09* (2006.01)
*G02B 7/182* (2006.01)

(52) U.S. Cl.
CPC ........... *G03F 7/702* (2013.01); *G02B 5/0891* (2013.01); *G02B 5/09* (2013.01); *G02B 7/182* (2013.01); *G03F 7/70066* (2013.01); *G03F 7/70083* (2013.01); *G03F 7/70233* (2013.01)

(58) Field of Classification Search
CPC ........ G02B 5/0891; G02B 5/09; G02B 7/182; G03F 7/70066; G03F 7/70083; G03F 7/702; G03F 7/70233
See application file for complete search history.

(56) References Cited

U.S. PATENT DOCUMENTS 3,514,781 A * 5/1970 Zimmerman .......... H01Q 1/005
 343/840
2011/0199600 A1 8/2011 Soer
2012/0224186 A1 9/2012 Hetzler et al.

FOREIGN PATENT DOCUMENTS

| CN | 1497353 A | 5/2004 |
|---|---|---|
| CN | 102725673 A | 10/2012 |
| JP | 2002-25898 A | 1/2002 |

OTHER PUBLICATIONS

German Office Action, with translation, for corresponding DE Appl No. 10 2012 216 502.9, dated May 7, 2013.
Chinese office action, with English translation thereof, for corresponding CN Appl No. 2013 8004 8023.3, dated Apr. 1, 2016.

* cited by examiner

Primary Examiner — Michelle M Iacoletti
(74) Attorney, Agent, or Firm — Fish & Richardson P.C.

(57) ABSTRACT

Mirror having a fragmented total surface area, wherein the fragmentation forms an aperiodic arrangement.

Figure 1:
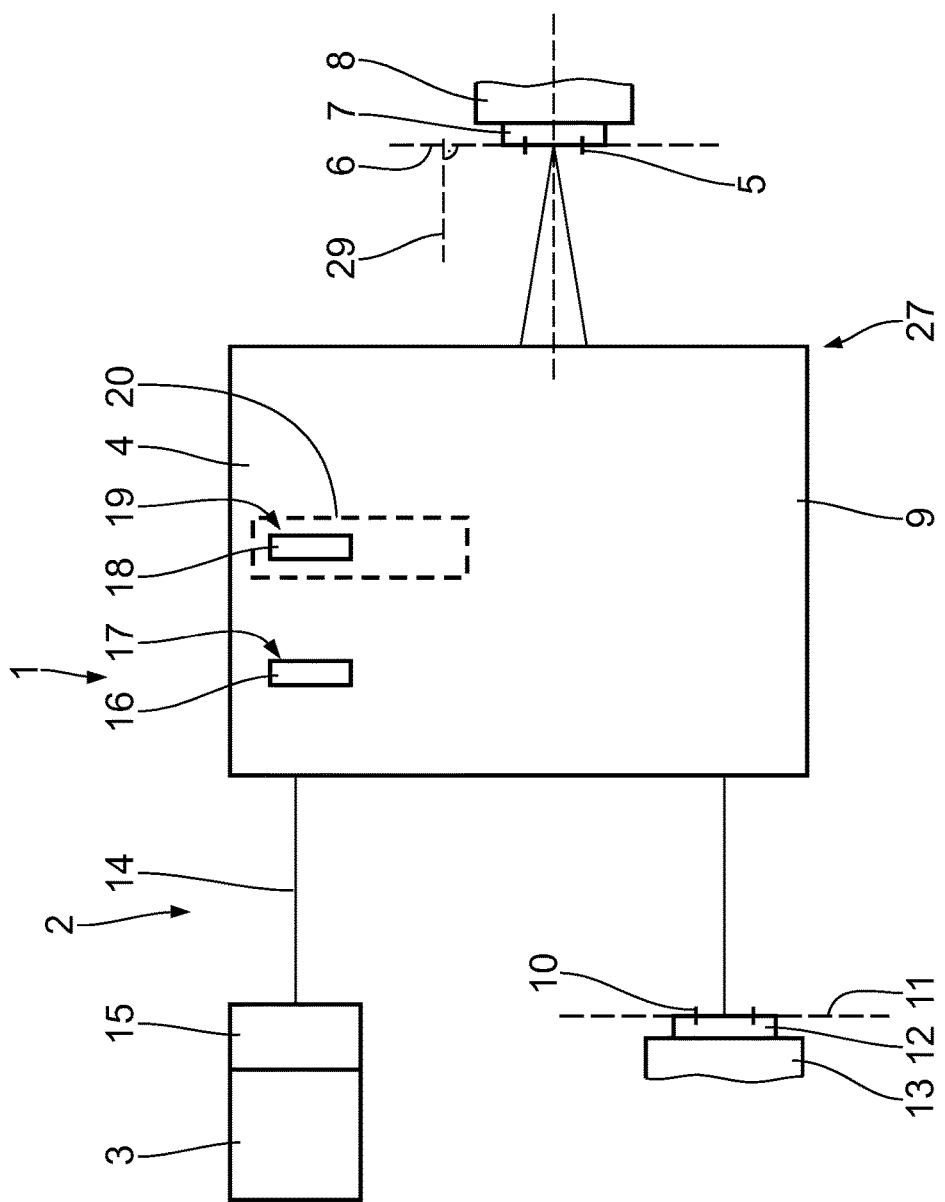

23 Claims, 17 Drawing Sheets

MIRROR

CROSS-REFERENCE TO RELATED APPLICATIONS

The present application is a continuation of, and claims benefit under 35 USC 120 to, international application PCT/EP2013/067965, filed Aug. 30, 2013, which claims benefit under 35 USC 119 of German Application No. DE 10 2012 215 502.9, filed Sep. 17, 2012. International application PCT/EP2013/067965 also claims priority under 35 USC 119(e) to U.S. Provisional Application No. 61/701,928, filed Sep. 17, 2012. The contents of international application PCT/EP2013/067965 and German patent application DE 10 2012 215 502.9 are incorporated herein by reference.

The invention relates to a mirror and an optical component comprising a mirror of this type. Furthermore, the invention relates to a projection optical unit comprising a mirror of this type, an optical system comprising a projection optical unit of this type, and a projection exposure apparatus comprising a projection optical unit of this type. Moreover, the invention relates to a method for optimizing the design of a mirror. Finally, the invention relates to a method for producing a micro- or nanostructured component.

Mirrors for EUV radiation in particular for an EUV projection exposure apparatus, are known for example from DE 10 2010 041 632 A1.

It is an object of the present invention to develop a mirror, in particular a mirror for EUV radiation, in such a way that it is possible to improve the optical quality of a projection exposure apparatus, in particular of an EUV projection exposure apparatus.

This object is achieved via a mirror having a fragmented total surface area including a multiplicity of first regions and at least one second, radiation-reflecting region. The first regions are in each case structurally delimited from the at least one second region and circumferentially surrounded thereby. The first regions are arranged aperiodically, and the first regions have a diameter in the range of 1 mm to 20 mm.

Firstly, reflectivity of a reticle serving as a lithography mask decreases greatly starting from a specific angle of incidence of the EUV radiation used for illumination. Secondly, in the case of illumination of the reticle with small angles of incidence, in particular in the case of perpendicular illumination of the reticle, i.e. in the case of a course of the chief ray of the illumination optical unit parallel to the optical axis and a perpendicular orientation of the reticle with respect thereto, obscurations of the beam path in the illumination and/or projection optical unit occur owing to constructional dictates. Particularly as the object-side numerical aperture increases, a corresponding increase in the chief ray angle is no longer possible without considerable losses in the reflectivity of the reticle. One approach according to the invention for solving this problem consists in embodying a mirror with a fragmented total surface area. The mirror comprises, in particular, a multiplicity of first regions, which are each structurally delimited from at least one second region and circumferentially surrounded thereby. The first regions form a multiplicity of obscurations with regard to the second, radiation-reflecting region. In other words, the totality of the first regions forms a fragmented obscuration of the mirror, in particular of the second, radiation-reflecting region. The individual first regions here are in each case preferably embodied in a simply connected fashion. Two different first regions respectively are embodied in a disconnected fashion. In particular, they are separated from one another by the second region.

According to the invention, it has furthermore been recognized that the arrangement of the first regions on the mirror has a crucial influence on the optical quality, in particular the imaging properties, which can be characterized, in particular, by imaging parameters such as telecentricity, normalized image logarithmic slope (NILS) and the variation thereof over the image field (NILS field profile).

The heart of the invention consists in arranging the first regions aperiodically on the mirror. They are arranged in particular asymmetrically, in particular non-point-symmetrically.

An aperiodic arrangement should be understood to mean an arrangement which, in particular, is not translationally invariant and/or not rotationally invariant. In accordance with one preferred embodiment, the arrangement of the first regions cannot be transformed into itself either by a displacement or by a rotation, or, in other words, upon any arbitrary displacement and/or rotation of the arrangement of the first regions there is a positive number thereof which overlaps the second region.

The diameter of the first regions is in particular in the range of 1 mm to 20 mm, in particular in the range of 2 mm to 15 mm, in particular in the range of 3 mm to 10 mm, in particular in the range of 4 mm to 8 mm.

One preferred arrangement of the first regions is, for example, one in which the first regions are respectively arranged at the lattice points of a Penrose tiling.

What can be achieved by such an arrangement of the first regions is that the orders of diffraction occurring upon reflection at the reticle, which are usually translationally invariant, impinge only statistically randomly on the first regions, i.e. the obscurations of the mirror. What can be achieved thereby in particular, is that the influence of the obscurations on the orders of diffraction is minimized. To put it the other way round, for any periodic arrangement of the obscurations it is possible to find reticle structures for which a large number of orders of diffraction are incident on the first regions, i.e. are obscured, which leads to a poor imaging quality for these structures.

In accordance with a further aspect of the invention, the arrangement of the first regions is such that, proceeding from an arrangement of all the first regions on the vertices of a lattice, at least 10%, in particular at least 20%, in particular at least 30%, in particular at least 50%, of the first regions are arranged in a manner offset with respect thereto by at least half of their diameter, preferably by at least their diameter. In this case, a regular, in particular a trigonal, square, hexagonal or concentric lattice or an aperiodic lattice, in particular a Penrose lattice, can serve as a starting point.

In accordance with a further aspect of the invention, it can be provided that the first regions, proceeding from an arrangement on the vertices of a lattice, are arranged in a manner offset with respect thereto by at most three quarters, in particular at most two thirds, in particular at most half, of an average distance between neighboring vertices of the lattice. What can be ensured thereby, in particular, is that the first regions are distributed relatively uniformly on the mirror. It has been established that this leads to a good telecentricity of the imaging.

The first regions are arranged on the mirror in particular in such a way that the imaging performance is improved setting- and pitch-independently, or at least for a set of settings and pitches. The first regions are arranged in particular in such a way that the telecentricity has a maximum value of 10 mrad, in particular maximally 7 mrad, preferably maximally 4 mrad.

In accordance with a further aspect of the invention, the first regions are arranged on the mirror in a manner distributed homogeneously in such a way that their local density in regions having a diameter of less than 50%, in particular less than 30%, in particular less than 20%, in particular less than 10%, in particular less than 5%, of the total diameter of the mirror deviates by at most 30%, in particular at most 20%, in particular at most 10%, from the average density of the first regions. Good telecentricity values of the imaging can be achieved by this approach as well. Moreover, it has been found that by this approach the imaging quality becomes relatively independent of the specific choice of illumination setting.

As an alternative to a homogeneous distribution of the first regions on the mirror, the first regions can also be arranged in such a way that their average density increases radially outwardly. The arrangement of the first regions can be, in particular, such that the average density thereof in ring-shaped regions whose radii deviate from one another by at most 30%, in particular at most 20%, in particular at most 10%, of the total radius of the mirror increases outwardly in a radial direction, in particular increases monotonically.

In accordance with a further aspect of the invention, the number of first regions is at least 100, in particular at least 200, in particular at least 300, in particular at least 500, in particular at least 700, in particular at least 1000. A larger number of first regions in this case leads to a smaller telecentricity error.

The number of first regions is in particular at most 30 000, in particular at most 10 000, in particular at most 5000, in particular at most 3000. It can also be at most 1000, in particular at most 500, in particular at most 300, in particular at most 200, in particular at most 100. A smaller number of first regions simplifies the production of the mirror.

In accordance with a further aspect of the invention, the totality of the first regions has a surface area which makes up at most 30%, in particular at most 20%, in particular at most 10% of the total surface area of the mirror. This ensures that the obscuration of the mirror is sufficiently small. Moreover, this ensures sufficiently high NILS values, in particular NILS>1, i.e. a sufficiently high contrast.

In accordance with a further aspect of the invention, the first regions are radiation-transmissive, in particular EUV-radiation-transmissive. They can be embodied in particular as through-openings. This allows illumination radiation to be threaded in from the rear side of the mirror.

It is also possible to arrange separate mirrors in the first regions. It is possible, in particular, to arrange pupil facets of a pupil facet mirror in the first regions. The pupil facet mirror can be part of the mirror. In this case, the pupil facets form the first regions.

The pupil facet mirror can also be separate from the fragmented mirror. In this case, the pupil facets are preferably arranged at the location of the first regions.

A further object of the invention is to improve an optical component, in particular for an EUV projection exposure apparatus.

This object is achieved via an optical component that includes at least one mirror described herein, and an adjusting device for adjusting the at least one mirror.

The heart of the invention consists in providing a mirror according to the preceding description with an adjusting device for adjusting the mirror.

This makes it possible, in particular, to adjust the mirror in the beam path of a projection exposure apparatus. As a result of an adjustment of the mirror, in particular the arrangement of the first regions is also adjusted.

The adjusting device can have in particular at least one, preferably two, translational, i.e. linear degrees of freedom, transversely, in particular perpendicularly to the optical axis or, expressed in the mirror system, perpendicularly to a central axis of the mirror, in particular a normal to the surface on the second region of the mirror in a central region thereof. Alternatively or additionally, it can have one rotational degree of freedom about the optical axis or about the normal to the surface. The adjusting device can enable a continuously variable adjustment of the mirror. It can also have or enable two or more discrete positions.

In accordance with a further aspect of the invention, the optical component comprises at least two mirrors according to the preceding description which are exchangeable via— the adjusting device. In this case, the adjusting device has, in particular, the function of an exchanging device. It can furthermore be suitable for the above-described adjustment, in particular for adjusting the exact positioning of the mirrors. This further increases the flexibility of the component.

A further object of the invention is to improve a projection optical unit for imaging an object field into an image field. This object is achieved via a projection optical unit for imaging an object field into an image field, the projection optical unit including a mirror described herein. The advantages correspond to those described above.

If the mirrors of the projection optical unit are numbered consecutively proceeding from the object field in the direction of the beam path, the mirror according to the invention can be used, in particular, as the first mirror (M1) or second mirror (M2) of the projection optical unit. When used as M2, the mirror can be arranged near the pupil, in particular. An arrangement of the mirror M near the pupil is present if the following condition is met:

$$P(M)=D(SA)/(D(SA)+D(CR))\geq 0.5.$$

In this case, D(SA) is the subaperture diameter of a pencil of rays proceeding from an object field point at the location of the mirror M and D(CR) is the maximum distance between chief rays of an effective object field, imaged by the imaging optical unit, measured in a reference plane of the optical system, on the surface of the mirror M. The reference plane can be a plane of symmetry or a meridional plane of the imaging optical unit. The definition of the parameter P(M) corresponds to that indicated in WO 2009/024164 A1. The following holds true in a field plane: P(M)=0. The following holds true in a pupil plane: P(M)=1. The following holds true, in particular, for the arrangement of the mirror M according to the invention: P(M)≥0.6, in particular P(M) ≥0.7, in particular P(M)≥0.8, in particular P(M)≥0.9.

As already described above, the first regions of the mirror form obscurations of the projection optical unit. They form overall a fragmented obscuration.

A further object of the invention is to improve an optical system of a projection exposure apparatus, and a projection exposure apparatus.

These objects are achieved via an optical system that includes an illumination optical unit for illuminating the object field with illumination radiation, and a projection optical unit described herein, wherein the first regions of the mirror are arranged in the beam path of the illumination optical unit, and the at least one second region of the mirror is arranged in the beam path of the projection optical unit.

The optical system can have an object-side numerical aperture (NAO) and a chief ray angle (CRA), wherein arcsin (NAO)≥CRA. These objects are also achieved via a projection exposure apparatus for microlithography including a radiation source and an optical system describe herein. The advantages correspond to those described above. The optical system makes it possible, in particular, to illuminate the reticle with a large object-side numerical aperture (NAO) and a small chief ray angle (CRA). The following holds true, in particular: arcsin (NAO)≥CRA, in particular arcsin (NAO)≥2 CRA. In this case, the following preferably holds true: CRA≤6°, in particular CRA≤3°, in particular CRA≤2°, in particular CRA≤1°, in particular CRA=0°. The object-side numerical aperture (NAO) is in particular at least 0.45, in particular at least 0.5, in particular at least 0.6, in particular at least 0.7. The optical system has a reduction of maximally 8:1, in particular maximally 6:1, preferably maximally 4:1.

A further object of the invention is to specify a method for optimizing the design of the mirror.

This object is achieved via a method for optimizing the design of a mirror described herein, which includes the following steps: a.) predefining a start design of the mirror with an arrangement of a number of first regions of the mirror on the vertices of a lattice; b.) predefining a fitness function (f) for assessing the imaging quality of a projection optical unit with a mirror of this type; c.) predefining at least one target value and a termination criterion; and d.) varying the arrangement of the first regions according to a predefined algorithm until the at least one predefined target value or the termination criterion is reached.

The invention provides for firstly predefining a start design of the mirror with an arrangement of a specific number of first regions of the mirror on the vertices of a lattice. In addition, a fitness function f for assessing the imaging quality of a projection optical unit with a mirror of this type is predefined. Finally, at least one target value and a termination criterion are predefined. The arrangement of the first regions is then varied according to a predefined algorithm until the at least one predefined target value and/or the termination criterion are/is reached.

As described above, a trigonal, square, hexagonal or concentric lattice or Penrose lattice can serve as the starting lattice.

Appropriate parameters incorporated in the fitness function include a selection of one or more of the following parameters: telecentricity, NILS, NILS field profile. The fitness function preferably comprises a linear combination of these parameters, in particular of all of these parameters.

A so-called evolutionary algorithm, in particular, serves as the algorithm for varying the arrangement of the first regions. So-called simulated annealing is also appropriate. Preferably, the evolution strategy is combined with a method that converges surely or at least approximately surely.

A series of secondary or boundary conditions, such as, for example, a minimum value of the homogeneity of the distribution of the first regions, can be taken into account in the algorithm.

In the simplest case, the algorithm comprises merely a linear translation and/or a rotation, in particular by an angle in the range of 0.1° to 5°. This is advantageous in particular for optimizing a mirror already present, in particular in conjunction with an adjusting device described above.

A further object of the invention is to specify a method for producing a component using the projection exposure apparatus.

This object is achieved according to the invention via a production method for producing a micro- or nanostructured component, including the following steps: providing a reticle; providing a wafer having a light-sensitive coating; projecting at least one portion of the reticle onto the wafer with the aid of a projection exposure apparatus described herein; and developing the exposed light-sensitive coating on the wafer.

The advantages correspond to those already described above.

Figure 2:
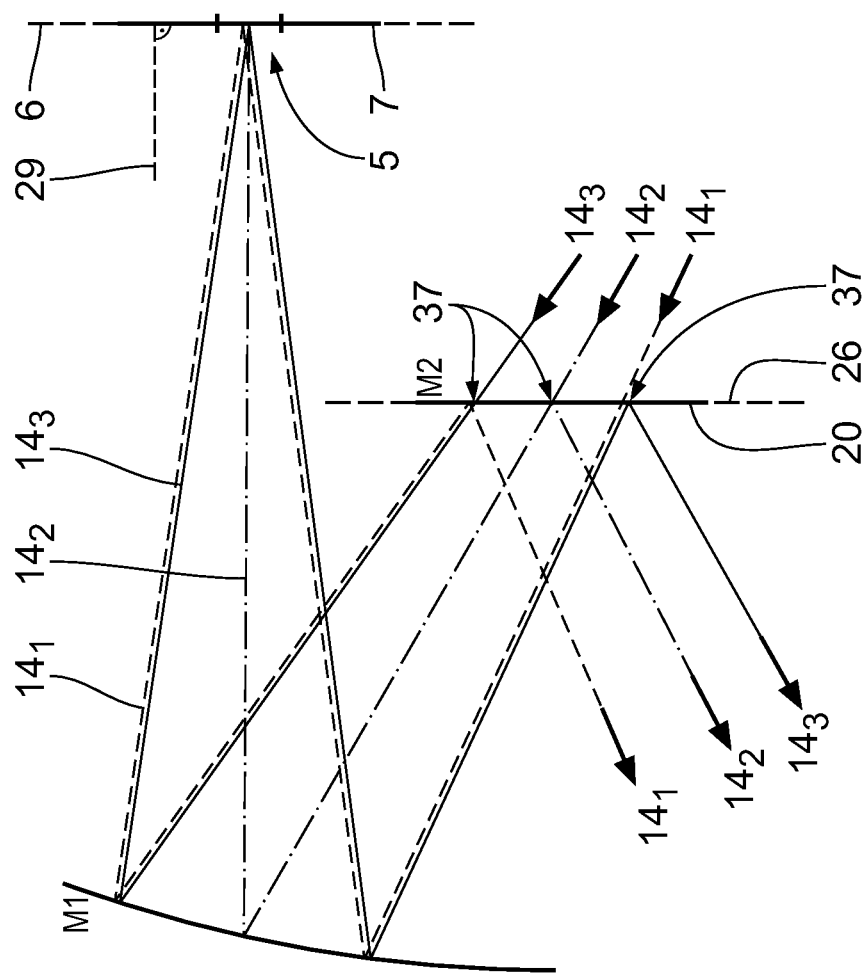
Figure 3:
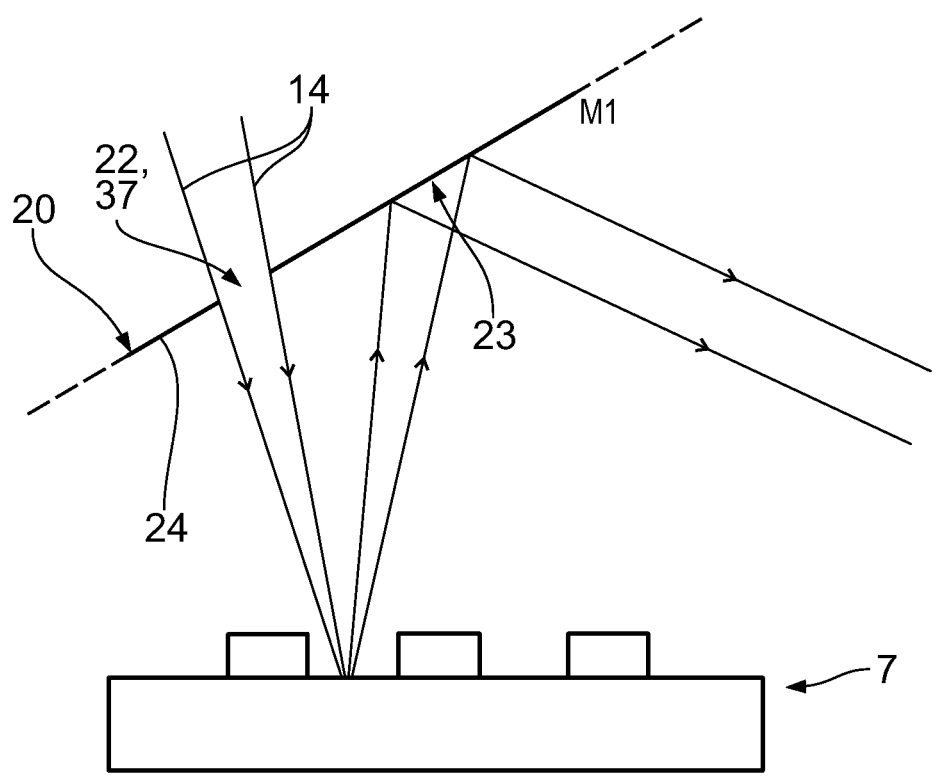
Figure 4:
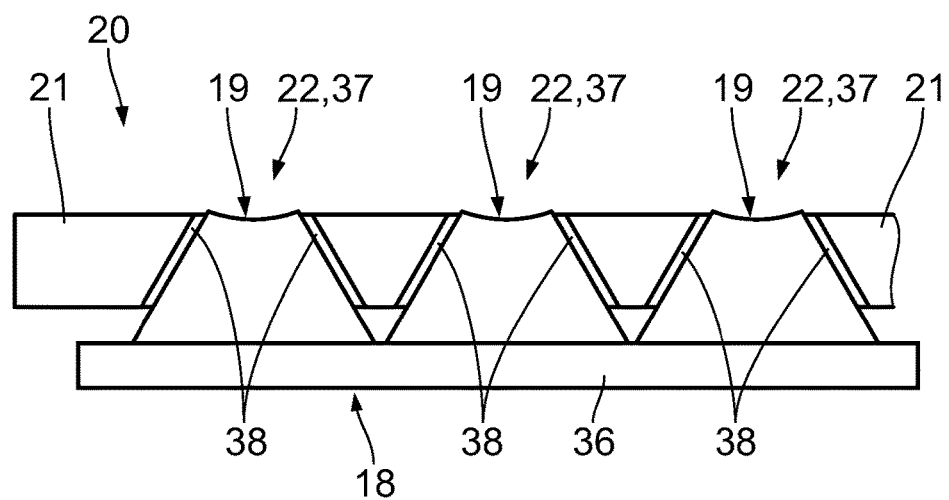
Figure 5:
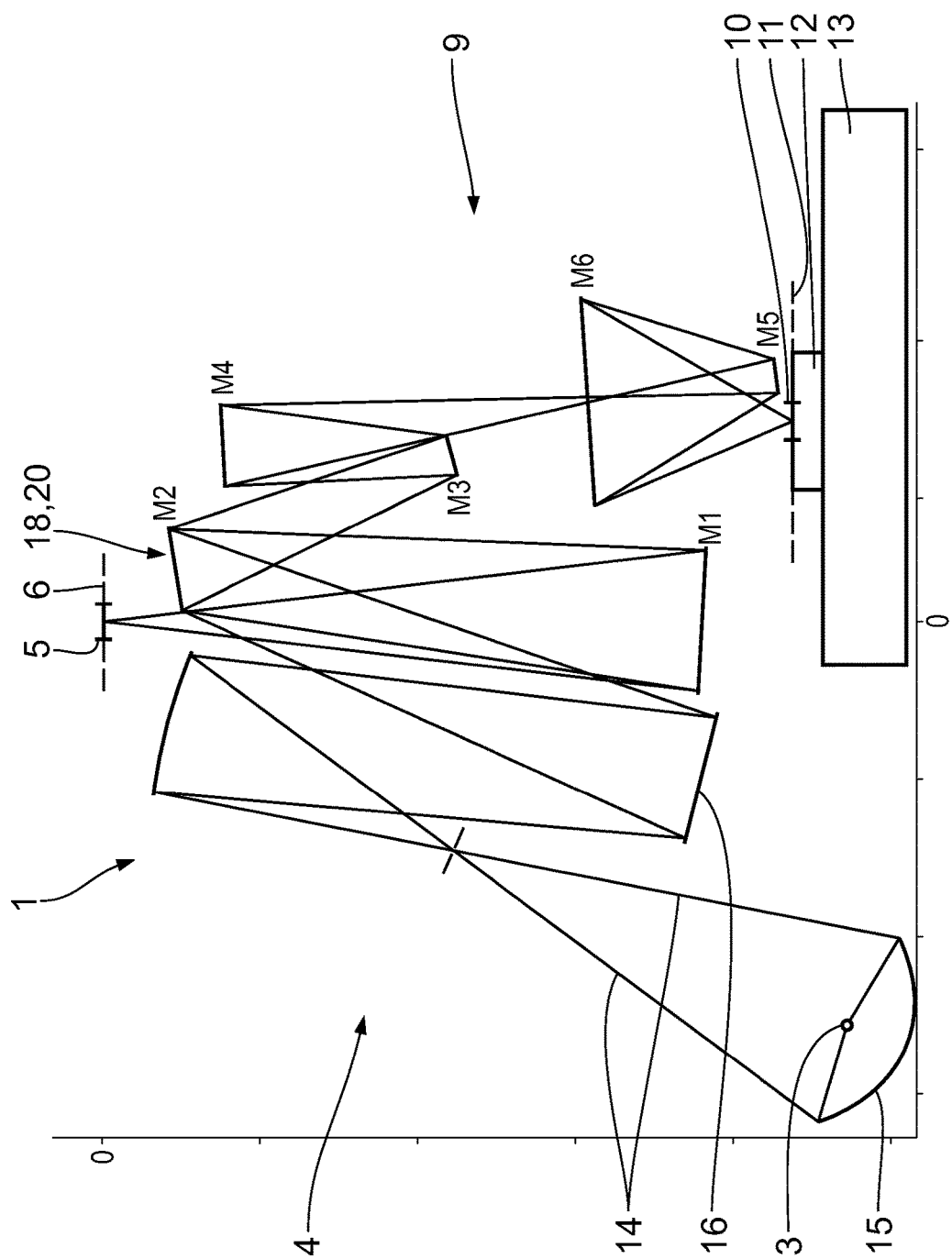
Figure 6:
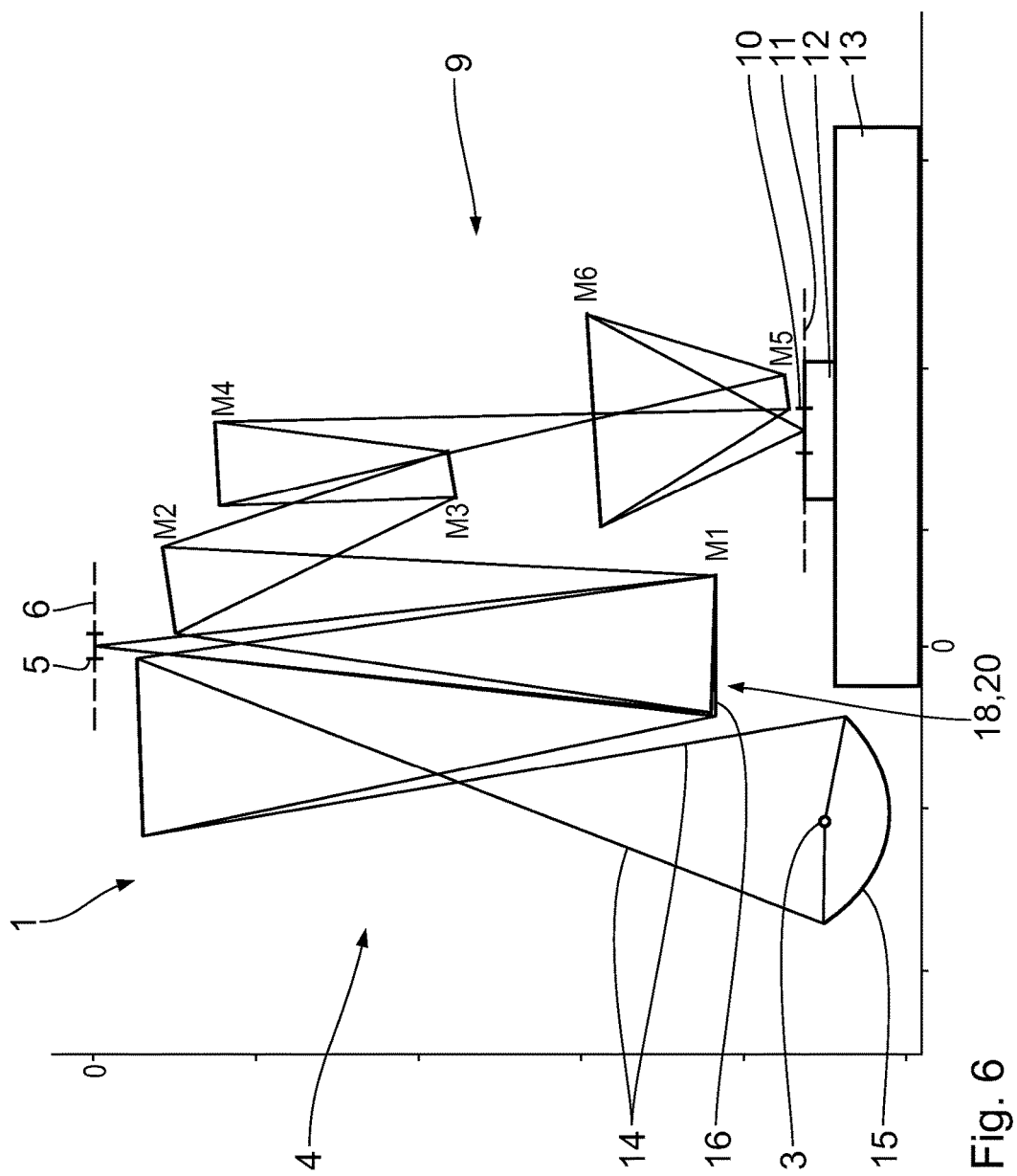
Figure 7:
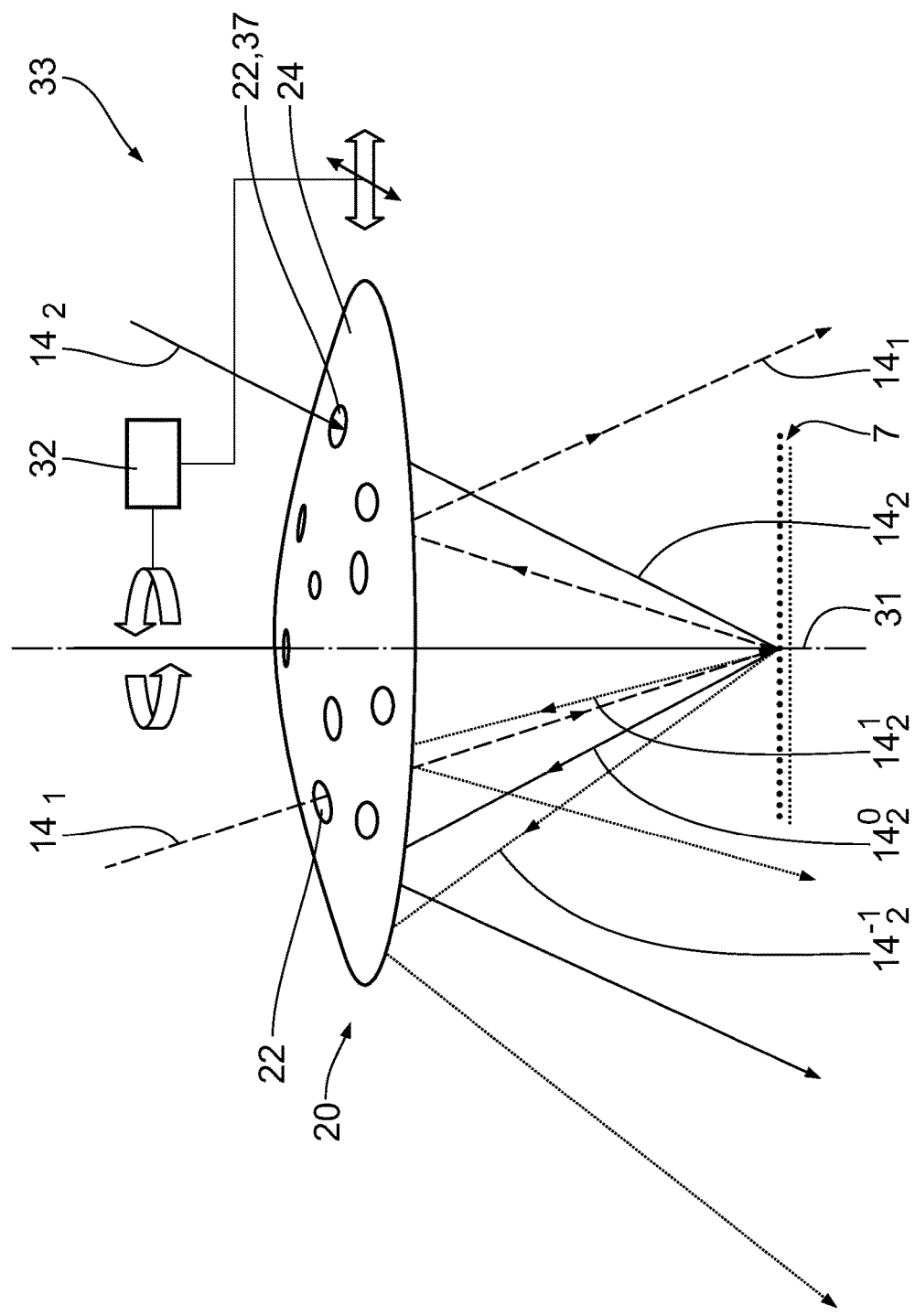
Figure 8C:
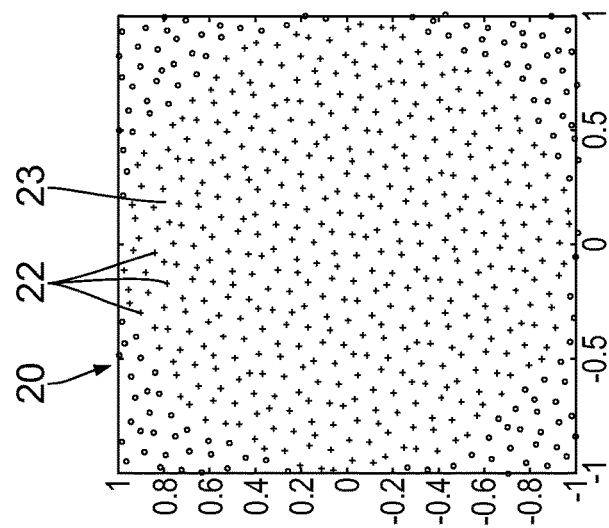
Figure 8B:
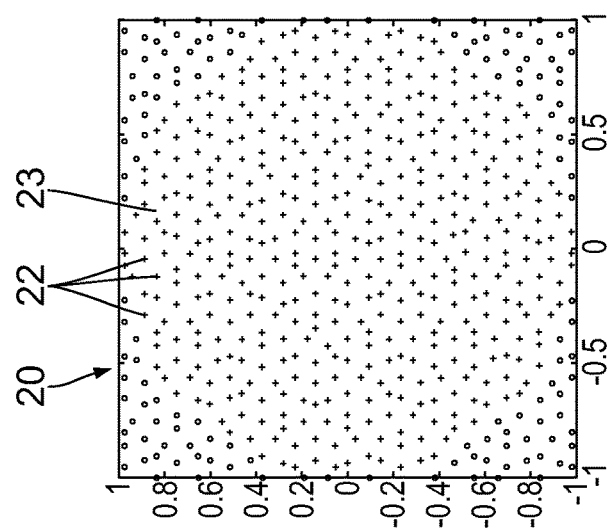
Figure 8A:
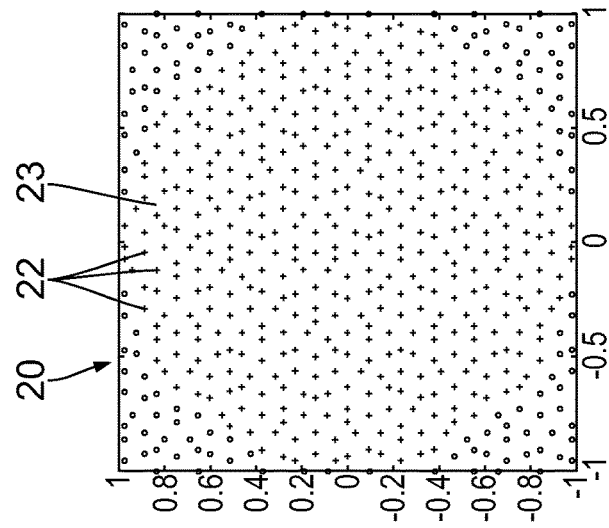
Figure 10:
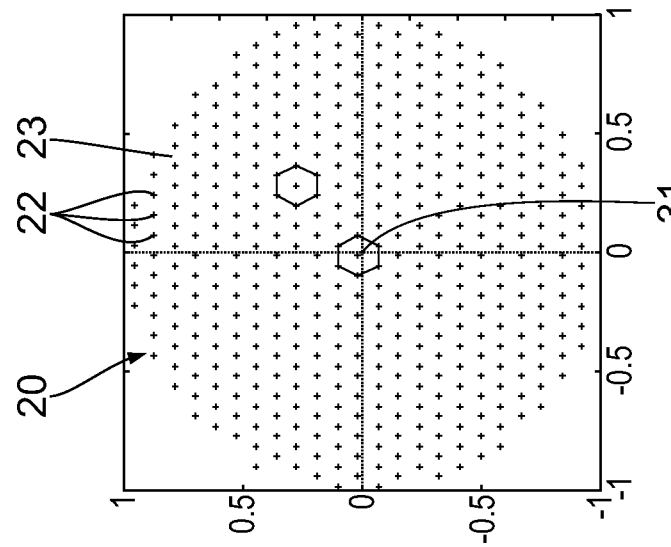
Figure 9:
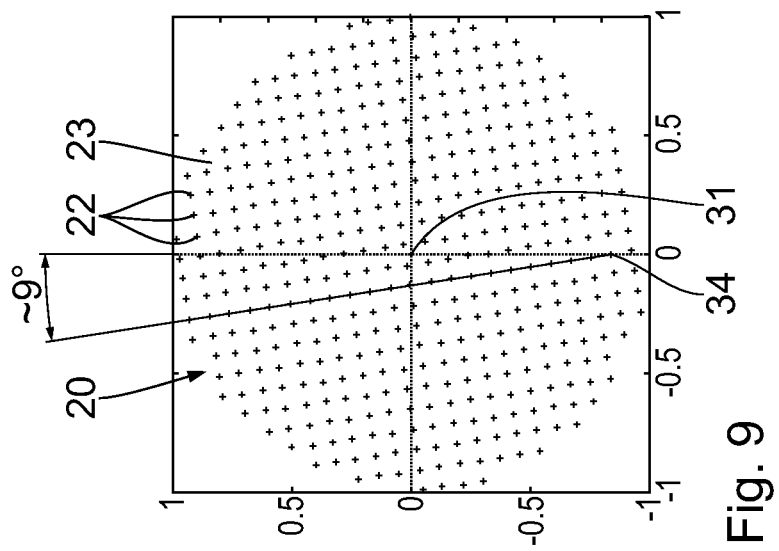
Figure 11B:
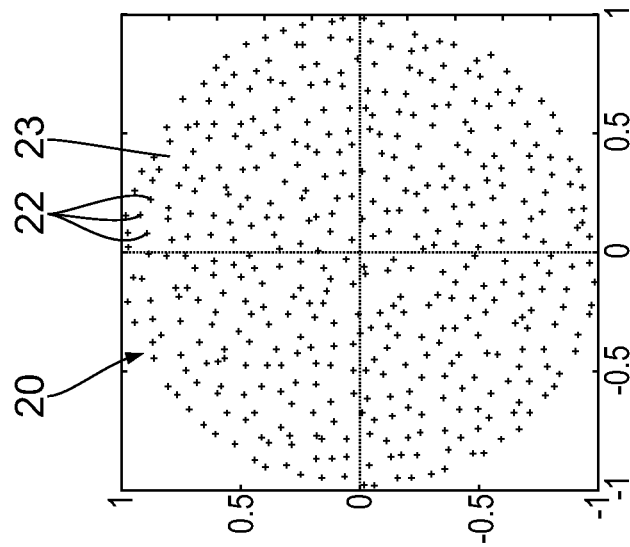
Figure 11A:
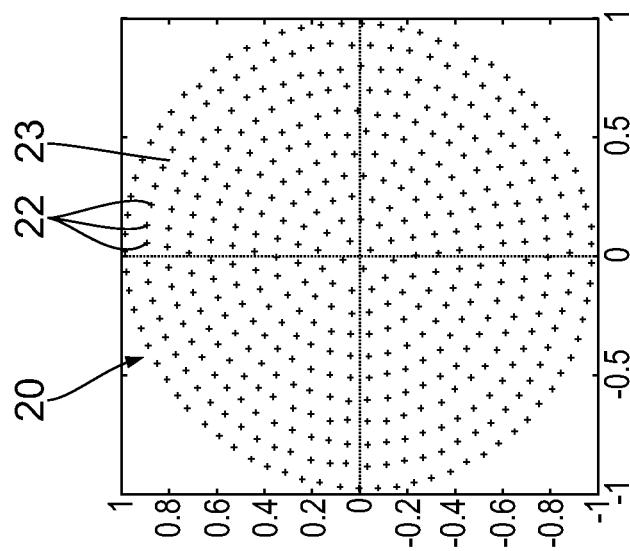
Figure 11C:
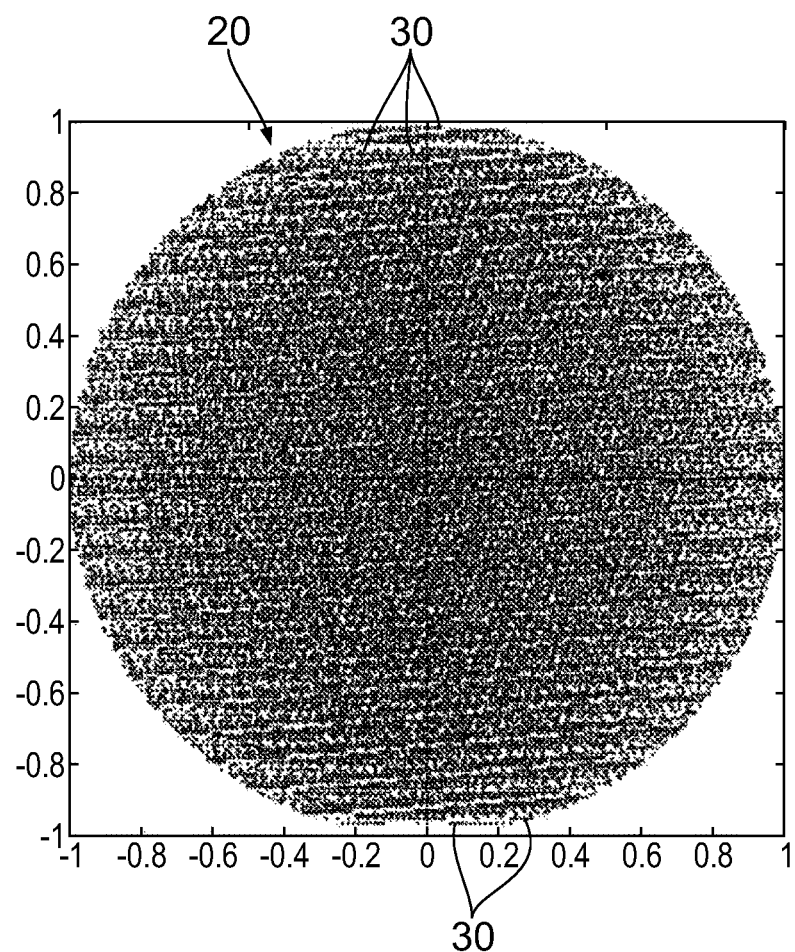
Figure 12B:
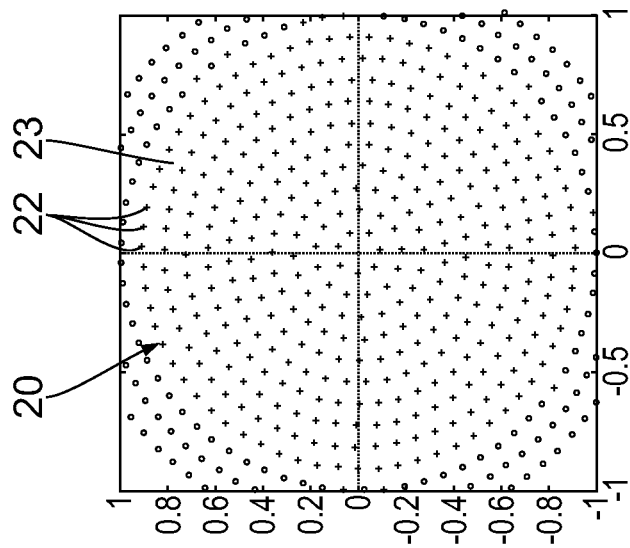
Figure 12A:
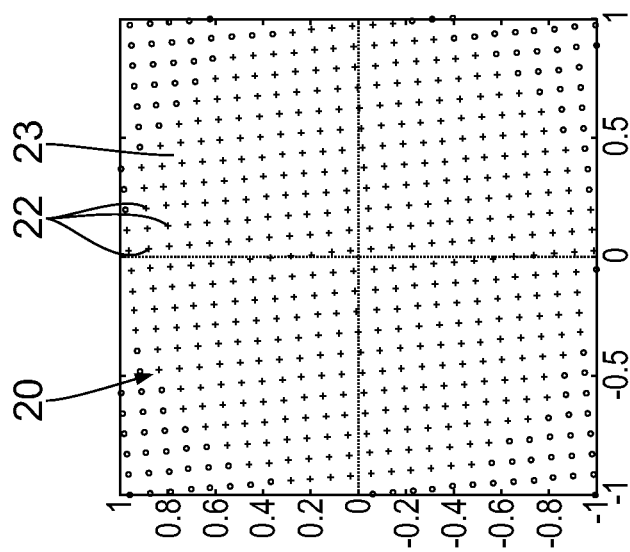
Figure 12D:
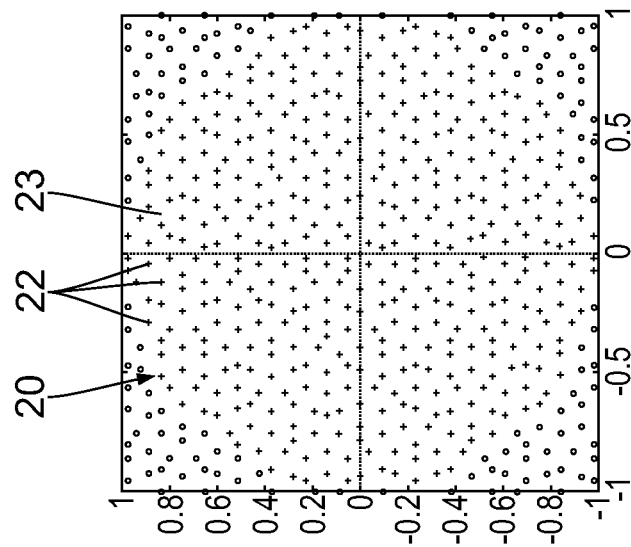
Figure 12C:
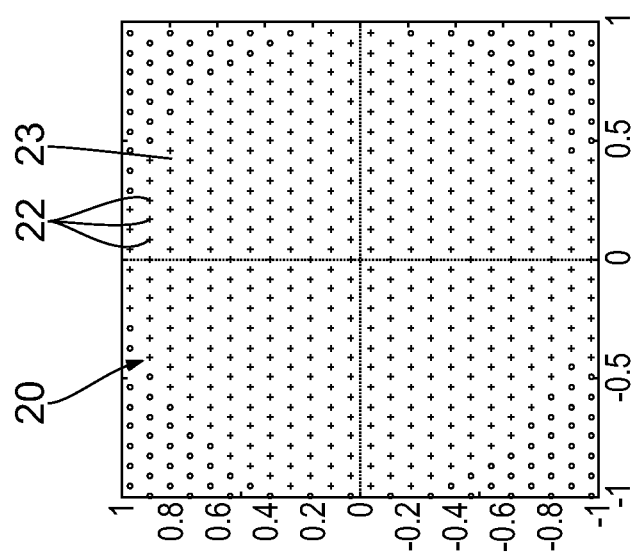
Figure 13:
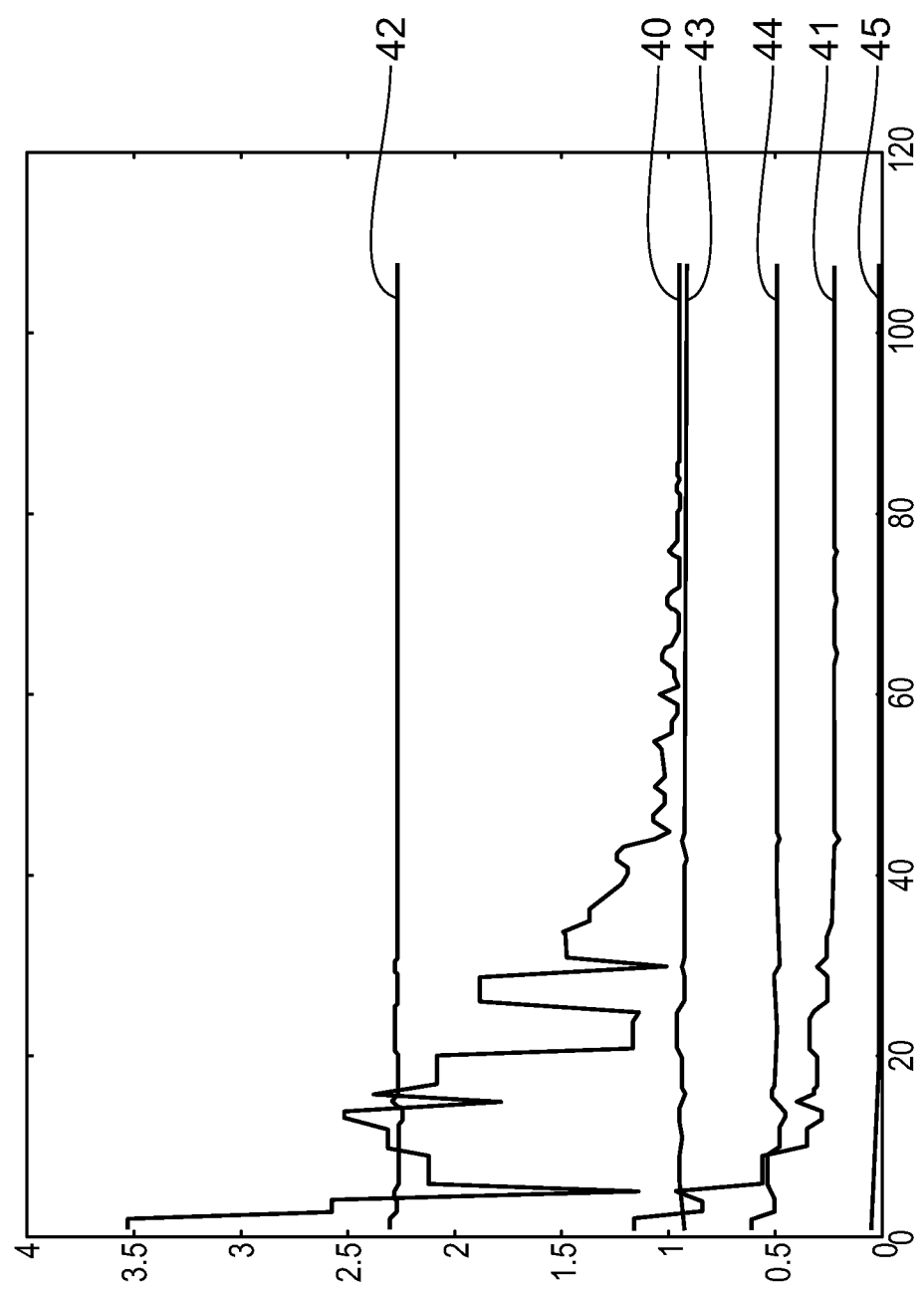
Figure 14B:
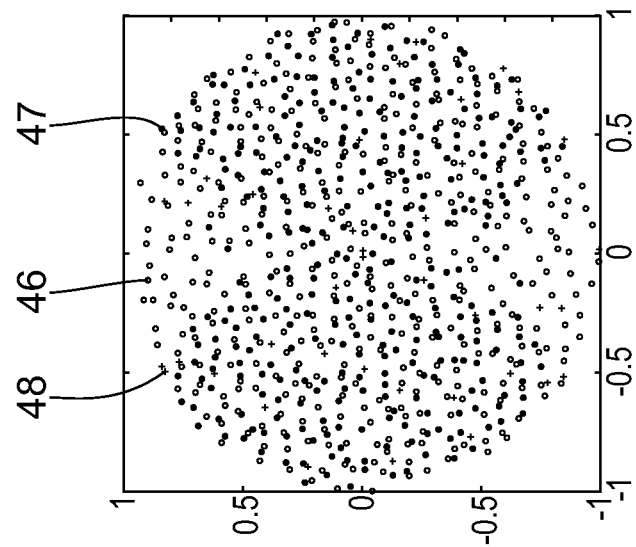
Figure 14A:
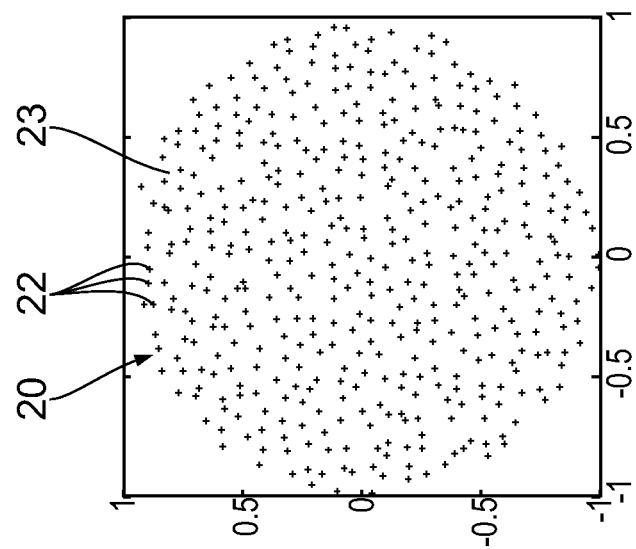
Figure 14C:
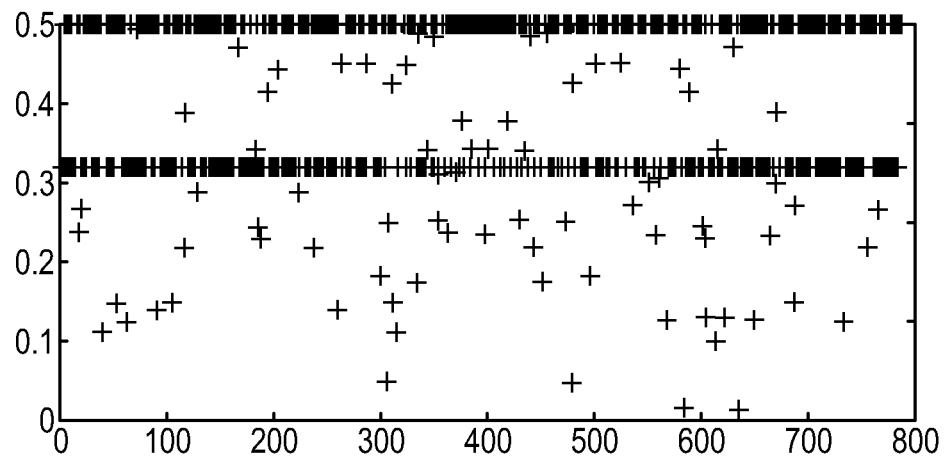
Figure 14D:
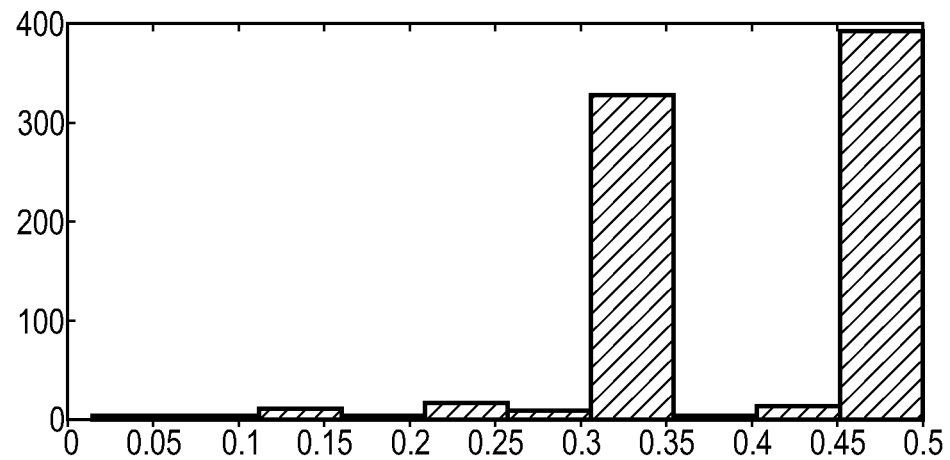

Further details and particulars of the invention will become apparent from the description of the number of exemplary embodiments with reference to the drawings, in which:

FIG. 1 shows a schematic illustration of the components of an EUV projection exposure apparatus for EUV lithography, FIG. 2 shows a schematic illustration of an excerpt enlargement of a beam path of illumination light and imaging light of the projection exposure apparatus according to FIG. 1 in the region of a reflective object in the form of a reticle, which object is to be imaged during the projection exposure, FIG. 3 shows a schematic illustration of an excerpt enlargement of a beam path of illumination light and imaging light similar to FIG. 2, but with an alternative routing of the beam path, FIG. 4 shows a schematic illustration of an embodiment of the mirror, FIG. 5 shows a schematic illustration of the arrangement of the mirror in the beam path of a projection exposure apparatus, FIG. 6 shows a schematic illustration of an alternative arrangement of the mirror in the beam path of a projection exposure apparatus, FIG. 7 shows a schematic illustration for elucidating the adjustability of the mirror, FIGS. 8a to 8c show illustrations of the effect of a displacement and of a rotation of the arrangement of the first regions on the mirror, FIG. 9 shows a further illustration of the effect of a rotation of the mirror, FIG. 10 shows a further illustration of the effect of the lateral displacement of the mirror, FIGS. 11a and 11b show an exemplary illustration of the arrangement of the first regions on the mirror before and after the optimization thereof, wherein a concentric arrangement of the first regions served as the starting arrangement, FIG. 11c shows an exemplary illustration of the filling of the illumination pupil with images of different orders of diffraction, which were taken into account in the evaluation of the optimization of the arrangement of the first regions on the mirror, FIGS. 12a to 12d show exemplary examples of possible starting arrangements of the first regions, FIG. 13 shows an exemplary illustration of the profile of some imaging-relevant parameters during an evolutionary optimization of the arrangement of the first regions on the mirror, FIG. 14a shows an exemplary illustration of an optimized arrangement of the first regions on the mirror, FIG. 14b shows images of the zero and first orders of diffraction on the mirror, the obscured orders of diffraction being identified, FIG. 14c shows the relative intensity of the images of the orders of diffraction in accordance with FIG. 14b, FIG. 14d shows a histogram of the distribution in accordance with FIG. 14c, and FIGS. 15a to 15c show schematic illustrations for clarifying a field-dependent obscuration of a field-independent illumination pupil.

FIG. 1 schematically shows, in a meridional section, the components of a projection exposure apparatus 1 for microlithography. In this regard, reference should additionally be made to DE 10 2010 041 623 A1 and DE 10 2011 086 345.1 which are hereby fully part of the present application. An illumination system 1 of the projection exposure apparatus 1 comprises, alongside a radiation source 3, an illumination optical unit 4 for exposing an object field 5 in an object plane 6. In this case, a reticle 7 arranged in the object field 5 is exposed, the reticle being held by a reticle holder, which is merely illustrated as an excerpt.

A projection optical unit 9 serves for imaging the object field 5 into an image field 10 in an image plane 11. A structure on the reticle 7 is imaged onto a light-sensitive layer of a wafer 12 arranged in the region of the image field 10 in the image plane 11, the wafer being held by a wafer holder 13, which is likewise illustrated schematically.

The radiation source 3 is an EUV radiation source which emits EUV radiation 14. The wavelength of the emitted used radiation of the EUV radiation source 3 is in the range of 5 nm to 30 nm. Other wavelengths which are used in lithography and for which suitable light sources are available are also possible; the radiation source 3 can be a plasma source, for example a DPP source or an LPP source. A radiation source based on a synchrotron can also be used as radiation source 3. Information about such a radiation source can be found by the person skilled in the art for example in U.S. Pat. No. 6,859,515 B2. A collector 15 is provided for focusing the EUV radiation 14 from the EUV radiation source 3.

The EUV radiation 14 is also designated as illumination light or illumination radiation.

The illumination optical unit 4 comprises a field facet mirror 16 having a multiplicity of field facets 17. The field facet mirror 16 is arranged in a plane of the illumination optical unit 4 which is optically conjugate with respect to the object plane 6. The EUV radiation 14 is reflected from the field facet mirror 16 to a pupil facet mirror 18 of the illumination optical unit 4. The pupil facet mirror 18 has a multiplicity of pupil facets 19. With the aid of the pupil facet mirror 18, the field facets 17 of the field facet mirror 16 are imaged into the object field 5.

For each field facet 17 on the field facet mirror 16 there is at least one associated pupil facet 19 on the pupil facet mirror 18. A light channel or radiation channel is formed between a respective field facet 17 and a respective pupil facet 19. The facets 17, 19 of at least one of the facet mirrors 16, 18 can be embodied as switchable. They can be arranged in particular in a tiltable fashion on the facet mirror 16, 18. In this case, it is possible to embody only a portion, for example at most 30%, at most 50% or at most 70% of the facets 17, 19 in a tiltable fashion. Provision can also be made for embodying all of the facets 17, 19 in a tiltable fashion. The switchable facets 17, 19 are the field facets 17, in particular. By tilting the field facets 17, it is possible to vary the assignment thereof to the respective pupil facets 19 and thus the formation of the light channels. A specific assignment of the field facets 17 to the respective pupil facets 19 is also designated as an illumination setting. For further details of the facet mirrors 16, 18 having tiltable facets 17, 19, reference should be made to DE 10 2008 009 600 A1.

For further details of the illumination optical unit 4, reference should likewise be made to DE 10 2008 009 600 A1.

The beam path of the EUV radiation 14 in the illumination optical unit 4 and the projection optical unit 9 and, in particular, the structural arrangement of the field facet mirror 16 and of the pupil facet mirror 18 cannot be gathered from FIG. 1.

The reticle holder 8 is displaceable in a controlled manner such that during projection exposure the reticle 7 can be displaced in a displacement direction in the object plane 6. Correspondingly, the wafer holder 13 is displaceable in a controlled manner such that the wafer 12 is displaceable in a displacement direction in the image plane 11. As a result, the reticle 7 and the wafer 12 can be scanned by the object field 5, on the one hand, and by the image field 10, on the other hand. The displacement direction is also designated as scanning direction. The displacement of the reticle 7 and of the wafer 12 in the scanning direction can preferably be effected synchronously with one another.

The projection optical unit 9 comprises a multiplicity of projection mirrors $M_i$, which are not illustrated in FIG. 1. The projection optical unit 9 comprises in particular at least three, in particular at least five, projection mirrors M1 to M5. It can have in particular at least six, seven or eight projection mirrors M1 to M8.

During the use of the projection exposure apparatus 1, provision is made of the reticle 7 and the wafer 12 bearing a coating that is light-sensitive to the illumination light 14. At least one portion of the reticle 7 is subsequently projected onto the wafer 12 with the aid of the projection exposure apparatus 1. In this case, the reticle 7 is illuminated with EUV radiation 14 in such a way that the chief ray (CRA, Chief Ray Angle) of the EUV radiation 14 impinges on the reticle 7 at an angle of incidence of at most 6°, in particular at most 3°, in particular at most 1°, in particular 0°. In this case, the angle of incidence is defined as the angle between the chief ray of the beam of rays serving for illuminating the reticle 7 and a normal 29 to the reticle 7. The angle of incidence of the chief ray is in particular less than the object-side numerical aperture (NAO), CRA<arcsin (NAO). The object-side numerical aperture (NAO) is in particular at least 0.45, in particular at least 0.5, in particular at least 0.6, in particular at least 0.7.

During the projection of the reticle 7 on the wafer 12, the reticle holder 8 and/or the wafer holder 13 can be displaced in a direction parallel to the object plane 6 and/or parallel to the image plane 11. The displacement of the reticle 7 and of the wafer 12 can preferably be effected synchronously with one another.

Finally, the light-sensitive layer on the wafer 12 that has been exposed with the illumination light is developed. A micro- or nanostructured component, in particular a semiconductor chip is produced in this way.

An optical system 27 according to the invention comprises the illumination optical unit 4 and the projection optical unit 9. The optical system 27 according to the invention has a mirror 20, which will be described in greater detail below.

The mirror 20 has a mirror body 21 having a total surface area 24. The total surface area 24 is also designated as total reflection surface 24 or simply as mirror surface 24. It is not necessarily embodied in a flat fashion. It can be embodied in particular in a curved fashion, for example in a convex or concave fashion. It can also be embodied in a plane fashion. The total surface area 24 comprises a multiplicity of first regions 22. The first regions 22 are embodied in a disconnected fashion. The number of first regions 22 is at least 10, in particular at least 30, in particular at least 100, preferably at least 200, preferably at least 300, preferably at least 500, preferably at least 600, preferably at least 800, preferably at least 1000.

The number of first regions is in particular at most 30 000, in particular at most 10 000, in particular at most 5000, in particular at most 3000. It can also be at most 1000, in particular at most 500, in particular at most 300, in particular at most 200, in particular at most 100. A smaller number of first regions simplifies the production of the mirror.

The number of first regions 22 is in particular at least equal in magnitude to the number of radiation channels. The number of first regions 22 is in particular at least equal in magnitude to the number of field facets 17. The number of first regions 22 can be equal in magnitude to the number of pupil facets 19. A ratio of the number of first regions 22 to the number of radiation channels, i.e. the number of pupil facets 19 to which illumination radiation 14 can be applied, is also designated as the flex ratio. The flex ratio is in the range of 1 to 2, in particular.

In addition, the mirror 20 comprises a second, radiation-reflecting, in particular EUV-radiation-reflecting, region 23. The combination of the first regions 22 and the second region 23 forms the total surface area 24 of the mirror 20.

The first regions 22 are each structurally delimited from the second region 23. They are each circumferentially completely surrounded thereby. The first regions 22 thus form islands in the second region 23. The second region 23 is preferably simply connected, but not contractible.

The first regions 22 are arranged in a manner distributed aperiodically on the total surface area 24. The arrangement of the first regions 22 will be described in greater detail below.

The first regions 22 are embodied in particular in each case in a round fashion, in particular in a circular fashion. They have linear dimensions, in particular a diameter, in the range of 1 mm to 20 mm, in particular in the range of 2 mm to 15 mm, in particular in the range of 3 mm to 10 mm, preferably in the range of 4 mm to 8 mm. In principle, it is also possible for the first regions 22 to be embodied in an angular fashion, in particular in a polygonal fashion, for example in a square or hexagonal fashion.

The first regions 22 have, in particular, a shape which, apart from a possible scaling, corresponds precisely to the shape of the pupil facets 19 on the pupil facet mirror 18.

The totality of the first regions 22 has a surface area which makes up at most 30%, in particular at most 20%, in particular at most 10%, of the total surface area of the mirror 20.

The first regions 22 are embodied in particular in a radiation-transmissive fashion, in particular in an EUV-radiation-transmissive fashion. Through-openings 37 in the mirror body 21 can be involved, in particular. As is illustrated schematically in FIGS. 2 and 3, in this case the illumination radiation 14 can pass through the first regions 22. In other words, the illumination radiation 14 can be threaded through the first regions 22 for illuminating the reticle 7, in particular into the projection optical unit 9.

The mirror 20 is in particular part of the projection optical unit 9. It is arranged in the projection optical unit 9 in particular in such a way that the first regions 22 are arranged in the beam path of the illumination optical unit 4, and the second region 23 is arranged in the beam path of the projection optical unit 9.

Figure 15A:
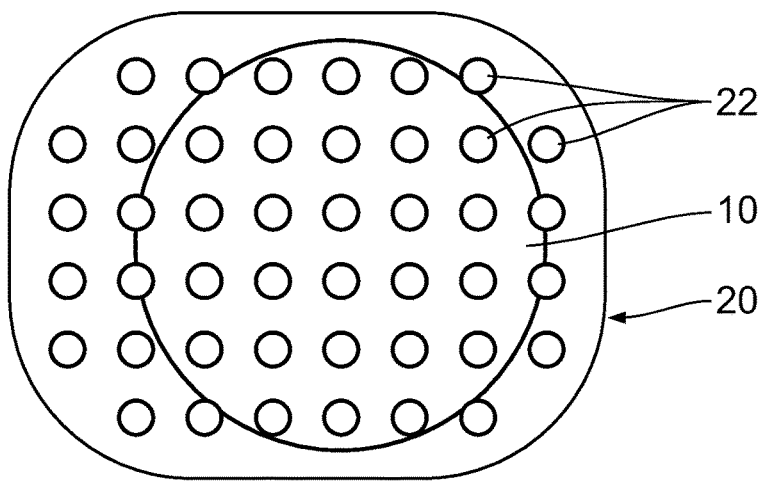
Figure 15B:
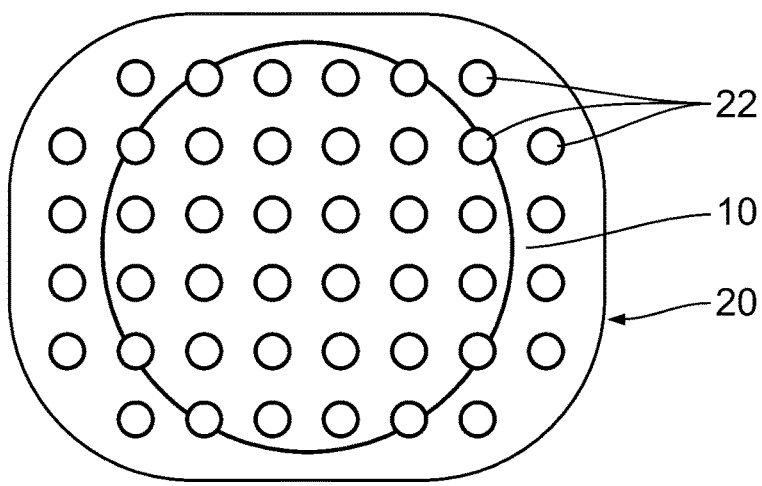
Figure 15C:
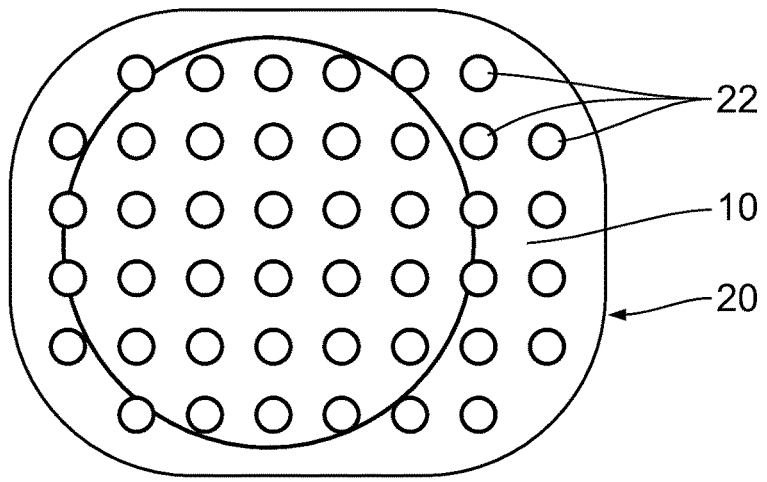

The mirror 20 can be arranged in the beam path of the illumination optical unit 4 in particular in such a way that the first regions 22 are arranged in the region of a pupil plane of the illumination. Particularly in the case of a homogenously divergent illumination of the reticle 7, the mirror 20 can be arranged in this way. This ensures that the illumination pupil does not vary over the object field 5. In other words, the same illumination pupil is present at every point of the object field 5. The illumination pupil is field-independent, in particular. In FIGS. 15a to 15c, this is illustrated schematically by the grid of the first regions 22. In this case, FIG. 15a schematically illustrates the illumination situation at the left-hand edge of the object field 5. FIG. 15b schematically illustrates the illumination situation in the center of the object field 5. FIG. 15c schematically illustrates the illumination situation at the right-hand edge of the object field 5. In this case, the grid of the first regions 22 serves merely for elucidating the field independence of the illumination pupil. It does not represent the actual arrangement of the first regions 22 on the mirror 20.

Since the mirror 20 is not necessarily situated in a pupil plane of the projection optical unit 9, a field dependence of the pupil obscuration is present in the region of the image plane 11, in particular in the region of the wafer 12. This is illustrated schematically in FIGS. 15a to 15c by the displacement of the relative position of the image field 10 with respect to the illumination pupil.

As is evident from FIGS. 15a to 15c, provision can be made for arranging more regions 22 on the mirror 20 than can be seen within the pupil. A region 22 which cannot be seen by the pupil should be understood to mean a region 22 which at least does not contribute directly to the illumination of the wafer 12. An arrangement of a larger number of regions 22 in the mirror 20 than can be seen in the pupil makes it possible for regions 22 which move out from the pupil as seen over the image field 10 to be replaced by other regions 22. This makes it possible to keep the geometric centroid of the obscured surface substantially constant. This makes it possible to reduce the resulting telecentricity error.

The dimensions of the mirror 20 are in particular larger than the dimensions of the illumination pupil maximally provided for illuminating a given point of the image field 10.

It is also possible to arrange the pupil facets 19 of the pupil facet mirror 18 in the through-openings 37. In this case, the pupil facets 19 are preferably arranged on an auxiliary substrate 36. They are separated from the mirror body 21 of the mirror 20 in each case by a gap 38. In this case, the first regions 22 do not form through-openings for the illumination light 14. In this embodiment, the mirror 20 and the pupil facet mirror 18 can be interpreted as part of a single component. It is likewise possible for the mirror 20 and the pupil facet mirror 18 to be interpreted as two separate components in this embodiment, too. In both cases, the first regions 22 form obscurations of the mirror 20, in particular of the second region 23, with regard to the beam path of the projection optical unit 9.

An inverted embodiment of the mirror 20, in which the first regions 22 are embodied in a radiation-reflecting fashion and are each circumferentially surrounded by the radiation-transmissive region 23, is likewise possible. For details, reference should be made to DE 10 2010 041 623 A1.

FIG. 2 illustrates by way of example a beam path of the illumination radiation 14 such as can be achieved with the mirror 20. Separate rays $14_1$, $14_2$, $14_3$ of the illumination radiation 14 passing in each case through one of the through-openings 37 through the mirror 20 are illustrated by way of example. The ray paths illustrated in FIG. 2 merely show a projection into the plane of the drawing. In particular, they do not represent the inclination of the illumination radiation 14 with respect to the plane of the drawing. Thus, in particular the ray $14_1$ passing through the mirror 20 does not correspond to the ray $14_3$ reflected back onto the mirror 20, but rather is skew with respect thereto.

In the case of the beam path of the illumination radiation 14 illustrated as an excerpt by way of example in FIG. 2, the mirror 20 serves as the second mirror M2 in the beam path of the projection optical unit 9. The mirror 20 serving as M2 can be arranged in particular in a pupil plane 26 or at least near the pupil in the projection optical unit 9. The following holds true, in particular: P(M2)≥0.5, in particular P(M2) ≥0.7, in particular P(M2)≥0.9.

FIG. 3 illustrates by way of example one possible functioning of the mirror 20 on the basis of an alternative arrangement in the beam path of the illumination radiation 14. In the case of the arrangement of the mirror 20 as illustrated in FIG. 3, the mirror serves as M1. The EUV radiation 14 from a light channel formed between respectively one of the field facets 17 and one of the pupil facets 19 passes through one of the first regions 22 through the mirror 20, is reflected at the reticle 7 and then impinges on the second region 23 of the mirror 20, from where it is reflected to the downstream mirrors $M_i$ of the projection optical unit 9.

FIGS. 5 and 6 illustrate by way of example arrangements of a mirror in accordance with FIG. 4 in which pupil facets 19 are arranged in the first regions 22. In FIG. 5, the mirror 20 serves as M2. FIG. 6 illustrates by way of example an embodiment in which the mirror 20 forms the M1.

In all embodiments of the mirror 20, the first regions 22 form obscurations of the second region 23. The mirror 20 is therefore also designated as a mirror having a fragmented obscuration.

The first regions 22 in particular do not contribute to the imaging of the object field 5 into the image field 10, in particular do not contribute to the imaging of the reticle 7 onto the wafer 12.

For an imaging of the object field 5 into the image field 10, in particular of the reticle 7 onto the wafer 12, in a manner as free from losses as possible, it is necessary for as far as possible all orders of diffraction, but in particular the 0, $1^{st}$ and $-1^{st}$ orders of diffraction, of the images of the object field 5, in particular of the reticle 7, to be projected into the image field 10. Obscuration of specific orders of diffraction leads to a loss of information and thus generally to a reduced imaging quality. As a result of a targeted arrangement of the first regions 22 on the mirror 20, the influence of the obscuration of individual orders of diffraction can be minimized or, to put it another way, the imaging quality can be improved. It is possible, in particular, to optimize the imaging quality for one or more different illumination settings and/or for different structures to be imaged on the reticle 7. An appropriate illumination setting involves, in particular, a selection from the following illumination settings: circular illumination setting with different radii, annular illumination settings with different inner and outer boundary radii, x-dipole settings, y-dipole settings and quasar illumination settings. A non-point-symmetrical arrangement of the first regions 22 relative to a central axis 31 of the mirror 20 makes it possible to ensure that the zero order of diffraction, which is also designated as specular reflection, does not impinge on one of the first regions 22. The invention therefore provides for arranging the first regions 22 point-asymmetrically, that is to say non-pointsymmetrically, on the mirror 20. The invention preferably additionally provides for arranging the first regions aperiodically on the mirror 20. An aperiodic distribution is advantageous since this then avoids the case where, for specific illumination settings and/or reticle structures, a multiplicity of orders of diffraction impinge systematically on the first regions 22, i.e. the obscurations, which would lead to a reduction of the imaging performance. In accordance with the exemplary embodiment shown in FIGS. 8a to 8c, the first regions 22 are arranged at the vertices or lattice points of a Penrose lattice. In this case, a Penrose lattice forms a special example of a non-translationally invariant and non-rotationally invariant lattice. In the case of this arrangement of the first regions 22, the usually translationally invariant orders of diffraction impinge on the first regions 22 only statistically randomly even in the case of the least favorable distribution of the first regions.

In one advantageous embodiment, the mirror 20 is provided with an adjusting device 32. The mirror 20 and the adjusting device 32 form an optical component 33. The adjusting device 32 is illustrated schematically in FIG. 7. It enables a linear, i.e. translational, displacement of the mirror 20, in particular in a direction perpendicular to the central axis 31 thereof. The adjusting device 32 thus enables an adjustability of the mirror 20 with at least one, preferably two, linear degrees of freedom. In addition or as an alternative thereto, it can enable an adjustment of the mirror 20 with one rotational degree of freedom, in particular a rotation of the mirror 20 about the central axis 31 thereof or about an axis parallel to the optical axis. The adjusting device 32 preferably enables a continuously variable adjustment of the mirror 20. However, it is also possible to embody the adjusting device 32 in such a way that it predefines different, discrete positions of the mirror 20. It can predefine in particular two or more discrete mirror positions.

In the case of a linear displaceability, the mirror 20 is preferably embodied in a planar fashion. In the case of a rotational displaceability, the mirror body 21, apart from the arrangement of the first regions 22, is preferably embodied rotationally symmetrically with respect to the central axis 31.

The linear displaceability can be in the range of micrometers, millimeters or centimeters. The rotational displaceability can be in the range of from a few millirad to 5°.

In accordance with one advantageous embodiment, the adjusting device 32 is embodied as an exchanging device or changing device for exchanging or changing two mirrors 20.

In other words, the optical component 33 can comprise one, two or more mirrors 20. The mirrors 20 can be exchanged via the adjusting device 32.

Via a displacement and/or a rotation, it is possible to alter the arrangement of the first regions 22 as a whole, i.e. globally. This is illustrated by way of example in FIGS. 8a to 8c. FIG. 8b shows an arrangement in accordance with FIG. 8a which was displaced linearly. The arrangement in accordance with FIG. 8c emerged from the arrangement in accordance with FIG. 8b via a rotation. On account of the field dependence of the obscuration, at a specific point of the image field 10 not necessarily all of the regions 22 contribute to the illumination thereof. This is illustrated in FIGS. 8a to 8c by different symbols for identifying the positions of the regions 22. The regions 22 which contribute to the illumination of an image field point selected by way of example are identified by the symbol + in FIGS. 8a to 8c, while the regions 22 which, although present on the mirror 20, do not contribute to the illumination of the field point are identified by the symbol o.

Further examples of a rotation and/or a displacement of a given arrangement are illustrated in FIGS. 9 and 10. An arrangement of the first regions 22 on the vertices of a regular, square lattice served as the starting arrangement in FIG. 9. This arrangement was rotated by approximately 9° about a decentered axis 34.

Via a rotation and/or a displacement of a given arrangement, the imaging performance can be improved for individual illumination settings and/or pitches. In other words, such possibilities of adjustment via the adjusting device 32 are advantageous in particular for improving the imaging performance of individual, in particular predefined, illumination settings and/or pitches.

In the case of the embodiment in accordance with FIG. 10, a trigonal lattice served as the starting arrangement. The lattice was displaced linearly by approximately ⅓ of the distance between neighboring first regions 22.

While the arrangement of the first regions 22 at the lattice points of a Penrose lattice already leads to improved imaging properties, the latter can be improved further by a targeted design of the mirror 20, in particular by an optimization of the arrangement of the first regions 22. A linear displacement and/or rotation of the mirror 20 via the adjusting device 32 as described above can be provided as the simplest form of an optimization. Such translationally and/or rotationally optimized arrangements can yield a good imaging performance for some pitches and settings. On account of the symmetries still present, however, there will always be pitches and/or settings for which these arrangements do not yield a sufficiently good performance. It has been recognized according to the invention that it is advantageous to break these symmetries via the separate optimization—described below—of the individual regions on the mirror, which leads to a statistical or aperiodic arrangement of the regions on the mirror. In accordance with one particularly advantageous embodiment, the arrangement of the first regions 22 is optimized according to the following method. Firstly, a start design of the mirror 20 with a specific arrangement of a predefined number of first regions 22 is predefined. Possible arrangements of the first regions 22 which can serve as start arrangements are illustrated by way of example in FIGS. 12a to d. Arrangements of the first regions 22 on the vertices of a lattice are involved, in particular. FIG. 12a illustrates the arrangement of the first regions 22 on the vertices of a square lattice. The latter is rotated by a few degrees. FIG. 12b illustrates the arrangement of the first regions 22 on concentric circles. FIG. 12c illustrates the arrangement on the vertices of a trigonal lattice. FIG. 12d illustrates the arrangement on the lattice points of a Penrose lattice. In principle, any desired start arrangements are possible. In particular, all of the start arrangements illustrated in FIGS. 12a-d in rotated and/or displaced form, too, can serve as start arrangement.

The start arrangement should preferably have a minimum homogeneity. The first regions 22 are arranged in a manner distributed homogeneously in particular in such a way that their local density in regions having a diameter of less than 50%, in particular less than 30%, in particular less than 20%, of the total diameter of the mirror 20 deviates by at most 30%, in particular by at most 20%, in particular by at most 10%, from their average density. This requirement made of the minimum homogeneity of the distribution of the first regions 22 is preferably predefined as a boundary condition in the optimization of the arrangement of the first regions 22. Consequently, in particular the optimized arrangement of the first regions 22 on the mirror 20 also has such a minimum homogeneity.

Furthermore, a fitness function f for assessing the imaging quality of the projection optical unit 9 with a mirror 20 of this type is predefined for optimizing the arrangement of the first regions 22. The fitness function f incorporates various parameters for assessing the imaging quality, in particular the telecentricity (TC) and/or the normalized image logarithmic slope (NILS) and/or the variation thereof over the image field 10 (NILS field profile). The fitness function f is in particular a linear combination of these three parameters. One possible fitness function f has the following form: $f=TC+g1*NILS$ field profile$-g2*NILS$, with positive weights g1, g2.

The optimization problem, namely minimizing the functional f, is thus defined. In particular the positions of the first regions 22, i.e. the arrangement thereof on the mirror 20, serve as variables. In principle, the number of first regions 22 and/or the size and/or shape thereof can also be incorporated as variables. Secondary or boundary conditions required include the minimum homogeneity described above and, in particular, the fact that two different first regions 22 do not mutually overlap.

Moreover, at least one target value for the fitness function f and a termination criterion are predefined for optimizing the arrangement of the first regions 22 on the mirror 20.

The arrangement of the first regions 22 is then varied according to a predefined algorithm until the at least one predefined target value and/or the termination criterion are/is reached.

In the special case where all first regions 22 are embodied in a circular fashion with an identical radius, the target functional f is invariant with interchange of the first regions 22. There are therefore many solutions to the optimization problem in the parameter range which describe an equivalent system. The target function f is therefore necessarily multimodal. Therefore, a global optimization method is provided as optimization algorithm. In particular an evolutionary algorithm, for example a genetic algorithm or so-called simulated annealing, is provided as optimization algorithm.

As a variant of the evolution strategy, provision is made for using the selection operator of a $(\mu+\lambda)$ evolution strategy. In this case, the parameter $\mu$ indicates the population size, the extent of the memory of the pole. The parameter $\lambda$ is the number of descendents.

In order to improve the convergence behavior of the algorithm, the latter is combined with a method that almost surely converges.

For optimizing the arrangement of the first regions 22, generally the arrangement of each individual one of the regions 22 is varied individually. It is provided, in particular, that at least 10% of the first regions 22, in particular at least 20%, in particular at least 30%, in particular at least 50% thereof, proceeding from an arrangement of all the first regions 22 on the vertices of a lattice, are arranged in a manner offset by a minimum amount. Half of the diameter or the diameter or a specific multiple of the diameter of the first regions 22 can serve as the minimum amount. The offset of the first regions 22 relative to the vertices of a lattice can be restricted to the effect that the first regions 22 are offset in each case by at most half of an average distance between neighboring vertices of the lattice. The offset of the first regions 22 can be adapted dynamically during each iteration step. The convergence behavior of the optimization can thereby be improved. The first regions are preferably offset according to a ⅕ success rule.

FIGS. 11a and 11b illustrate by way of example the arrangement of the first regions 22 on the mirror 20 before and after optimization. A concentric arrangement of the first regions 22 served as the starting arrangement (see FIG. 11a).

As also in FIGS. 8a to 8c, 9, 10, 12a to d, 14a and 14b, the illustration of the arrangement of the first regions 22 in FIGS. 11a and 11 b illustrates only the position thereof, but not the size thereof. In the case of the exemplary embodiment illustrated in FIGS. 11a and 11b, the first regions 22 have a radius of 0.018 of the radius of the maximally illuminated region of the mirror 20. In this regard, it should again be noted that the mirror 20 is preferably larger than the illumination pupil, as a result of which undesirable telecentricity effects on account of a field-dependent obscuration can be avoided.

FIG. 11 c illustrates by way of example the illumination pupil with the images 30 of all orders of diffraction which were taken into account in the optimization of the arrangement of the first regions 22. As can be seen qualitatively from FIG. 11c, the illumination pupil is densely filled. What can thereby be achieved is that the optimization leads to an improvement of the imaging performance which is to the greatest possible extent independent of the illumination setting and/or the structures to be imaged of the reticle 7.

Provision is made, in particular, for taking account, in the optimization, of all orders of diffraction whose intensity is at least 20% of the incident intensity of a given radiation channel. In particular at least the 0 and $\pm 1^{st}$ order of diffraction are taken into account.

Furthermore, provision is made, in particular, for taking account of a plurality of field points which are preferably arranged in a manner distributed uniformly over the object field 5. In particular at least three, in particular at least five, in particular at least eight, in particular at least twelve, field points are taken into account.

Furthermore, provision is made, in particular, for taking account of different pitches in the evaluation. In particular at least three, in particular at least five, in particular at least eight, in particular at least twelve, in particular at least twenty, in particular at least thirty, pitches can be taken into account. In the case of the illumination pupil illustrated in FIG. 11 c, twelve different pitches distributed logarithmically equidistantly in the range of 22 nm to 320 nm were taken into account.

Furthermore, provision is made, in particular, for taking account of different illumination settings. The illumination settings to be taken into account can be selected, in particular, from the following list: x-dipole, y-dipole, quasar, C-quad, circular with $\sigma_{max} \leq 0.7$, circular with $\sigma_{max}=1$, annular, in particular with $0.3 \leq \sigma \leq 0.5$, and annular with $0.5 \leq \sigma \leq 1$. Preferably, a combination of at least two, in particular at least three, in particular all, of these settings is taken into account.

Such a dense filling of the pupil can ensure that the position of each of the regions 22 is taken into account during the optimization of the arrangement thereof. For optimizing the arrangement of the regions 22, the imaging parameters (normalized image logarithmic slope, telecentricity error) can be calculated in each case for different settings and/or pitches. Provision can then be made, subsequently in order to calculate the fitness of the arrangement, for using in each case the worst value of these parameters. If the correspondingly determined fitness is greater than for the previous arrangements of the regions 22, then the new arrangement is used as the optimum.

FIG. 13 illustrates the development of the parameters for assessing the imaging quality as a function of the number of iterations. In this case, the curve 40 represents the centuple of the NILS field profile. The curve 41 represents the profile of the telecentricity. The telecentricity was in the lower single-digit mrad range for all the field points. The telecentricity error had in particular for all field points a maximum value of less than 10 mrad, in particular less than 7 mrad, in particular of at most 4 mrad. The curve 42 represents the profile of the normalized image logarithmic slope (NILS). The NILS value was at least 2, in particular at least 2.3 for all field points.

The curves 43 and 44 each represent the decuple of the maximal and minimal minimum distance, respectively, between the first regions 22.

The curve 45 represents the value, expressed in percent of the radius of the illumination pupil (% σ), by which the position of the regions 22 is displaced in the respective iteration. The variation of the position of the regions 22 is adapted dynamically during the optimization. The dynamic adaptation is effected, in particular, in accordance with the so-called ⅕ success rule. This has the consequence that the algorithm converges faster. If the procedure is already near an optimum, the variation is increasingly reduced. In the example illustrated, the variation was initially 0.1 mσ, i.e. ¹⁄₁₀₀% of the radius of the illumination pupil. Starting approximately from the $50^{th}$ iteration, the variation was less than 0.01 mσ.

As can be discerned qualitatively from FIG. 13, the algorithm converges after fewer than 100 iterations.

The method according to the invention makes it possible to ensure that the imaging performance reaches a predefined minimum value for all relevant illumination settings and/or pitches. The imaging performance can be optimized in particular for all relevant settings and/or pitches. The optimization can be carried out, in particular, in such a way that the imaging performance is substantially independent of the illumination settings and/or pitches.

FIG. 14a illustrates a further optimized arrangement of the first regions 22 of the mirror 20. FIG. 14b illustrates a distribution, corresponding thereto, of the images of the 0 orders of diffraction 46 and of the $\pm 1^{st}$ orders of diffraction 47. In this case, the images of the obscured orders of diffraction 48, i.e. the images of the orders of diffraction which overlap one of the first regions 22 of the arrangement in accordance with FIG. 14a, are identified. As can be discerned qualitatively, the proportion of obscured orders of diffraction 48 is far less than 10%, in particular less than 3%, in particular less than 1%.

The result from FIG. 14b is summarized again in FIGS. 14c and 14d. FIG. 14c plots the intensity of the 0, $1^{st}$ and $-1^{st}$ orders of diffraction relative to the intensity—normalized to 1—of a given radiation channel against the radiation channels. In the non-obscured case, the intensity of the zero order of diffraction is 0.5, and that of the ±1st orders of diffraction is 0.333. Entries which do not lie at 0.5 or 0.333 correspond, in other words, to radiation channels which at least partly overlap one of the first regions 22, i.e. are obscured. The distribution in accordance with FIG. 14c is summarized in FIG. 14d. As can be gathered from these figures, the position of the 0 orders of diffraction is substantially free of overlap with the first regions 22. Moreover, only a small part of the $\pm 1^{st}$ orders of diffraction is obscured by the regions 22.

In accordance with a further embodiment according to the invention, for the fine adjustment of the intensity distribution in the pupil, the arrangement of the individual first regions 22 can be varied slightly in order to partly obscure part of the intensity of the respective pupil spot, i.e. to reduce the intensity thereof.

Furthermore, in accordance with one advantageous embodiment, provision can be made for adjusting the beam path of individual illumination channels if the orders of diffraction thereof are obscured, i.e. are incident on one of the first regions 22. This is possible particularly in the case of switchable facet mirrors 16, 18.

In one particularly advantageous development of the combination of the mirror 20 with the pupil facet mirror 18 in accordance with FIG. 4, these two mirrors 20, 18 are embodied as a single optical component. They are embodied in particular as a microelectromechanical system (MEMS) having an array comprising a multiplicity of individual mirrors (Multi Mirror Array, MMA). For details of such micromirrors and the driving thereof, reference should be made to DE 10 2009 034 502 A1. In the case of such an MEMS, the assignment of the micromirrors to the pupil facets 19 arranged in the first regions 22 and to the second region 23 forming a mirror $M_i$ of the projection optical unit 9 can be set in a variable manner. In other words, a drivable position, i.e. arrangement of the first regions 22, is made possible. Moreover, the tilting of the micromirrors and thus the tilting of the first regions 22 are adjustable. In this embodiment, the first regions 22 are thus arranged on the mirror 20 in a variable manner, i.e. in a manner displaceable during the operation of the projection exposure apparatus 1.

As an alternative to use in a projection exposure apparatus, the mirror 20 according to the invention can also be used in an inspection apparatus, in particular for inspecting reflective lithography masks or for inspecting exposed wafer substrates. In this case, the image field 10 of the projection optical unit 9 constitutes an inspection object field of the inspection apparatus.

The invention claimed is:

1. A mirror, comprising:
a fragmented total surface area, comprising:
a multiplicity of first regions which arranged aperiodically, each of the first regions having a diameter in the range from one millimeter to 20 millimeters; and
a second region which is a radiation-reflecting region,
wherein each of the first regions is structurally delimited from the second region, and each of the first regions is circumferentially surrounded by the second region.

2. The mirror of claim 1, wherein at least 10% of the first regions of the mirror are offset by at least half of their diameter compared to an arrangement in which all the first regions are on vertices of a lattice.

3. The mirror of claim 1, wherein, compared to an arrangement in which all the first regions are on vertices of a lattice, the first regions of the mirror are offset by at most half an of an average distance between neighboring vertices of the lattice.

4. The mirror of claim 1, wherein the first regions are homogeneously distributed so that a local density of the first regions in regions having a diameter of less than 50% of a diameter of the mirror has a deviation of at most 30% from an average density of the first regions over the entire mirror.

5. The mirror of claim 1, wherein the mirror comprises at least 100 first regions.

6. The mirror of claim 1, wherein a total surface area of the multiplicity of first regions comprises at most 30% of a total surface area of the mirror.

7. The mirror of claim 1, wherein the first regions are radiation-transmissive.

8. The mirror of claim 7, wherein at least 10% of the first regions of the mirror are offset by at least half of their diameter compared to an arrangement in which all the first regions are on vertices of a lattice.

9. The mirror of claim 7, wherein, compared to an arrangement in which all the first regions are on vertices of a lattice, the first regions of the mirror are offset by at most half an of an average distance between neighboring vertices of the lattice.

10. The mirror of claim 7, wherein the first regions are homogeneously distributed so that a local density of the first regions in regions having a diameter of less than 50% of a diameter of the mirror has a deviation of at most 30% from an average density of the first regions over the entire mirror.

11. The mirror of claim 7, wherein the mirror comprises at least 100 first regions.

12. The mirror of claim 1, wherein:
the mirror comprises a multiplicity of second regions;
each of the second regions is a radiation-reflecting region;
each of the first regions is structurally delimited from each of the second regions, and
each of the first regions is circumferentially surrounded by the multiplicity of second regions.

13. The mirror of claim 12, wherein the first regions are radiation-transmissive.

14. A component, comprising:
a mirror according to claim 1; and
an adjusting device configured to adjust the mirror,
wherein the component is an optical component.

15. The component of claim 14, wherein the component comprises a second mirror according to claim 1, and the adjusting device is configured to exchange the mirrors.

16. A unit, comprising:
a mirror according to claim 1,
wherein the optical unit is a projection optical unit configured to image an object field into an image field, and the unit is an optical unit.

17. A system, comprising:
an illumination optical unit configured to illuminate an object field with illumination radiation; and
a projection optical unit configured to image the object field into an image field, the projection optical unit comprising a mirror according to claim 1,
wherein the system is an optical system.

18. The system of claim 17, wherein the first regions are arranged in a beam path of the illumination optical unit, and the second region is arranged in a beam path of the projection optical unit.

19. The system of claim 18, wherein the system has an object-side numerical aperture (NAO) and a chief ray angle (CRA), and arcsin (NAO)≥CRA.

20. An apparatus, comprising:
a radiation source;
an illumination optical unit configured to illuminate an object field with illumination radiation; and
a projection optical unit configured to image the object field into an image field, wherein
the projection optical unit comprises a mirror according to claim 1, and the apparatus is a microlithography projection exposure apparatus.

21. A method of operating a microlithography projection exposure apparatus comprising an illumination optical unit and a projection optical unit, the method comprising:
using the illumination optical unit to illuminate an object field with illumination radiation; and
using the projection optical unit to image the object field into a light sensitive coating,
wherein the projection optical unit comprises a mirror according to claim 1.

22. The mirror of claim 1, wherein the second region is an EUV-radiation-reflecting region.

23. A method, comprising:
i) selecting a start design of a mirror which comprises an arrangement of a number of first regions on vertices of a lattice;
ii) selecting a fitness function for assessing an imaging quality of a projection optical unit comprising a mirror with the start design;
iii) selecting a target value and a termination criterion;
iv) varying the arrangement of the first regions according to an algorithm until the target value or the termination criterion is reached; and
based on i)-iv), making a mirror;
disposing the mirror in a projection optical unit of a microlithography projection exposure apparatus, the microlithography projection exposure apparatus further comprising an illumination optical unit;
using the illumination optical unit to illuminate an object field with illumination radiation; and
using the projection optical unit to image the object field into a light sensitive coating,
wherein the mirror comprises:
   a fragmented total surface area, comprising:
      a multiplicity of first regions which arranged aperiodically, each of the first regions having a diameter in the range from one millimeter to 20 millimeters; and
      a second region which is a radiation-reflecting region, and
wherein each of the first regions is structurally delimited from the second region, and each of the first regions is circumferentially surrounded by the second region.

* * * * *

UNITED STATES PATENT AND TRADEMARK OFFICE
CERTIFICATE OF CORRECTION

PATENT NO. : 9,678,439 B2
APPLICATION NO. : 14/623882
DATED : June 13, 2017
INVENTOR(S) : Ingo Saenger et al.

It is certified that error appears in the above-identified patent and that said Letters Patent is hereby corrected as shown below:

In the Specification

Column 1, Line 10, delete "215" and insert -- 216 --.

Column 1, Line 16, delete "215" and insert -- 216 --.

Column 4, Line 18, delete "via—" and insert -- via --.

Column 6, Line 50, delete "11 c" and insert -- 11c --.

Column 11, Line 23, delete "M," and insert -- $M_i$ --.

Column 14, Line 42, delete "descendents." and insert -- descendants. --.

Column 15, Line 3, delete "11 b" and insert -- 11b --.

Column 15, Line 12, delete "11 c" and insert -- 11c --.

Column 15, Line 38, delete "11 c," and insert -- 11c, --.

In the Claims

Column 17, Line 48, Claim 3, after "half", delete "an".

Column 18, Line 2, Claim 9, after "half", delete "an".

Signed and Sealed this
Twenty-seventh Day of March, 2018

Andrei Iancu
*Director of the United States Patent and Trademark Office*